July 26, 1955

R. N. HALL ET AL 2,714,183

SEMI-CONDUCTOR P-N JUNCTION UNITS AND
METHOD OF MAKING THE SAME

Filed Dec. 29, 1952

Inventors:
Robert N. Hall,
William E. Burch,
by Paul A. Frank
Their Attorney.

United States Patent Office 2,714,183

Patented July 26, 1955

2,714,183

SEMI-CONDUCTOR P-N JUNCTION UNITS AND METHOD OF MAKING THE SAME

Robert N. Hall and William E. Burch, Schenectady, N. Y., assignors to General Electric Company, a corporation of New York Application December 29, 1952, Serial No. 328,437

14 Claims. (Cl. 317—235)

Figure 1:
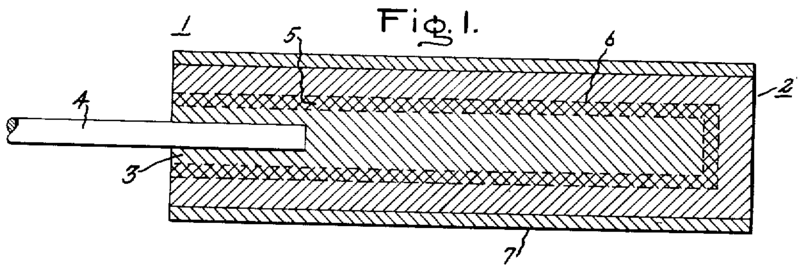

Our invention relates to semi-conductor devices and more particularly to rectifiers and transistors of the P–N junction type and to a method of making them.

Semi-conductors, such as germanium and silicon, have become conventionally classified as either positive (P-type) or negative (N-type), depending primarily upon the type and sign of their predominant conduction carriers. Whether a particular semi-conductor body exhibits N-type or P-type characteristics lies primarily in the type of significant impurity elements or activators present in the semi-conductor. Some such activator elements, called donors, function to furnish additional free electrons to the semi-conductor so as to produce N-type semi-conductors with an electronic excess while others, called acceptors, function to absorb electrons from the semi-conductor to create P-type semi-conductors with an excess of positive conduction carriers or "positive holes." P–N junction semi-conductor units have a zone of P-type semi-conductor adjoining a zone of N-type semi-conductor to form an internal space charge barrier having a relatively large or broad area as distinguished from the point-contact-type of device. This junction possesses marked rectifying properties, as well as thermoelectric and photoelectric properties. A semi-conductor body having a region of one conductivity type adjoining two regions of opposite conductivity type to form two P–N junctions can be used to make a three-terminal amplifying device known as a transistor. In such devices the common zone is the base, and the zones adjoining are the emitter and collector.

Problems arise in the construction of either two-element rectifier devices or three-element transistor devices of the broad area or P–N junction type which are rugged and can maintain their characteristics over a sufficiently long period of time. In many types of construction, the devices are rather fragile and difficult to assemble, and to the extent that the P–N junctions are near the exposed surface of the semi-conductor material, humidity and aging effects may become very objectionable. Such structural problems are aggravated in the transistor device, especially in designs intended for operation at relatively high power levels because of the relatively small spacing required between the two transistor junctions.

Accordingly it is an object of our invention to provide a simple and rugged P–N junction device.

It is another object of our invention to provide an improved method for manufacturing such junction devices.

It is a further object of our invention to provide a simple and rugged junction transistor having very little of the junction interface exposed.

It is yet another object of our invention to provide a multiple P–N junction device suitable for operation at relatively high power levels.

In accordance with our invention, a semi-conductor body of one conductivity type is provided with at least one bore or recess therein which contains an activator element of the opposite conductivity type fused to the inner surfaces of the bore or recess to form a zone within the semi-conductor body of the opposite conductivity type represented by the activator element. The junction between this zone surrounding the activator element and the main body of the semi-conductor provides an internal P–N junction in which humidity effects are virtually eliminated and aging effects are minimized. By providing a number of such recesses containing a junction-forming activator element in the same semi-conductor body and connecting the activator electrodes in parallel the power level is increased while still maintaining the rugged construction and ease of manufacture. An improved transistor construction is thereby facilitated since adjacent activator electrodes are adapted to serve as emitter and collector electrodes respectively, the semi-conductor body serving as the base element.

The novel features which are believed characteristic of the invention are set forth in the appended claims. The invention itself, together with further objects and advantages therein, may best be understood by reference to the following description taken in connection with the accompanying drawing in which Fig. 1 is a sectional view of a simple P–N junction type of device embodying the invention and Fig. 2 is a perspective view of a multiple P–N junction type of device embodying the invention and connected for use as a transistor.

Figure 2:
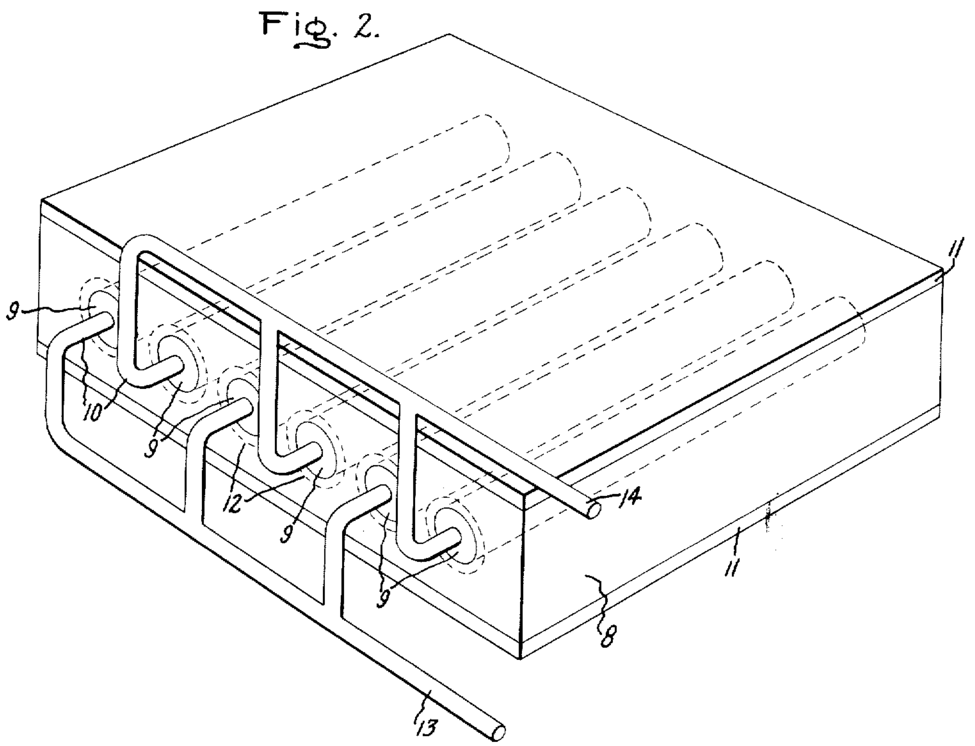

Referring now to Fig. 1, one embodiment of the invention is shown as comprising a single P–N junction rectifier device 1 comprising a generally cylindrical body 2 of a semi-conductor material of one conductivity type. This body 2 may suitably be made of a bar of N-type germanium cut from a single crystal. A hole is bored into the semi-conductor body 2 along its major axis to form a relatively deep recess. Within the hole is a rod 3 of one or more acceptor activators or impurity elements, indium being suitable for this purpose. A good electrical contact is made to the indium bar 3 to provide a convenient electrode, this electrode suitably taking the form of a wire conductor 4 having one end embedded in the indium rod. The indium is fused to the inner side walls of the bore in the germanium body 2 to provide a rectifying contact, the indium diffusing into the surface for a distance to convert a portion 5 of the germanium body to a P-type semi-conductor. This zone 5 is represented by the cross-hatched area of Fig. 1. The junction of the P-type and N-type zones within the germanium body forms a generally cylindrical rectifying barrier or broad area P–N junction 6. An electrode for facilitating electrical connection to the external surface of the germanium body comprising the external boundary of the N-type zone may be made by coating that external surface with a solder layer 7. In operation, such a device is utilized as is any other semi-conductor diode by connecting it in circuit between the center electrode 4 and the outer electrode 5, the device permitting easy current flow when terminal 4 has a positive potential with respect to terminal 7 and presenting its high or inverse impedance to current flow in the other direction.

In preparing such a device, a germanium body 2 of the N-type is preferably employed because of its ease of preparation and general availability. If desired, however, the N-type characteristics can either be derived from or increased by the presence of a donor element in the outer layer 7 such as antimony, and heating the assembly so that the antimony is fused to the surface of the germanium and diffuses into that surface so that it introduces excess negative conduction carriers to produce an outer N-type region of the desired resistivity and thickness. It is generally simpler, however, to cut the germanium bar 2 from a single crystal ingot prepared as N-type with the desired activator element uniformly distributed therein. In such a case, the shape of the germanium body may depart from any degree desired from the cylindrical form, the cylindrical shape indicating that configuration requiring the least amount of germanium and providing the most efficient outer electrode. In order to provide a maximum junction area and to provide as much of it as possible within the germanium body and not exposed to humidity or aging at the end surface, the recess in germanium bar preferably has a depth several times greater than its diameter.

In making the hole in the germanium body, care must be taken not to shatter the surface of the bore during the cutting operation. One way in which the holes may be satisfactorily cut is to direct a jet of chlorine or other fluid halogen against the germanium, the germanium being heated to a temperature somewhat in excess of 400° C. for rapid cutting and being surrounded by an inert or reducing atmosphere such as nitrogen or forming gas. In this method, the germanium combines with the chlorine to form gaseous germanium tetrachloride and the hole is left clean and bright without the need of a further etching treatment to remove surface defects. Very small holes, such as, for example, 0.025" in diameter or less may be cut by this method at a fairly rapid rate. Other means of drilling holes, of course, may be suitably employed, the chief problem usually being to conveniently make holes which are small enough for an activator member of economic size.

The indium or other activator element is heated to the liquid state to provide the necessary fused contact with the side walls of the bore or recess in the germanium body, and it may be inserted in any desired form in the hole before the heat treatment for forming the junction occurs. Thus it may be placed in the hole in the powdered state, or a rod of approximately the same size of the hole bore may be inserted, or molten indium may be poured into the bore in the germanium body. The above-described method of forming the fused rectifying contact includes a portion of the invention disclosed and claimed in a copending application Serial No. 187,490, filed September 29, 1950, by William C. Dunlap, Jr., and assigned to the assignee of the present invention. The contact with the activator element provided by the wire 4 is readily made by inserting one end of the wire into the molten activator element during the heat treatment required for fusion. This wire is made of nickel or platinum or other suitable conductor which will not dissolve in the indium and adversely affect the P–N junction characteristics.

A multiple junction device is shown in Fig. 2 where the semi-conductor body 8 takes the form of a slab of N-type germanium cut from a single crystal. This slab is preferably rectangular in shape and has major dimensions substantially greater than its thickness dimension. A series of recesses or bores for receiving the activator members 9 each extend along one major dimension of the slab and are closely arrayed in a row along the other major dimension, the bores being started from one of the edges of the slab between its major faces. The activator elements 9 and wire electrodes 10 therefor are made as described with relation to Fig. 1 and conductive coatings or layers 11 are placed in good conductive contact with the major faces of the slab. The assembly is heated as previously described to fuse the indium or other activator element employed with the side walls of the bores in the germanium body to convert a portion of the material surrounding the bores to P-type germanium and create a junction 12 surrounding each activator electrode.

In order that the multiple junction device thus far described may operate effectively as a transistor, the bores in the germanium body are spaced sufficiently closely and the extent of impregnation of the germanium by the activator element within the bores is controlled so that the junction areas 12 of adjacent bores are very close to each other with only a thin layer of the N-type material between them. The thickness of the germanium slab is also predetermined to provide a relatively small distance between the facing portions of a cylindrical junction area 12 and either major face of the germanium slab. In such a construction, the electrodes 11 form the base electrodes of a transistor and adjacent activator electrodes 10 form respectively emitter and collector electrodes. In the construction illustrated where six activator bores are employed, one set of three alternate activator electrodes 10 is connected in parallel to a bus 13 serving as the emitter terminal and the other set of three alternate activator electrodes 10 is connected in parallel to the collector bus 14. In this way, not only is a greater portion of the junction area 12 for each intermediate activator member made more effective, but the parallel connection also multiplies the power handling capabilities of the device. The base electrode 11 has a large area since it includes both major surfaces of the germanium slab, and can be very effectively cooled as is desired for relatively high power outputs.

The number of bores and thus the number of P–N junctions can be increased to any desired number for the desired power level. The various activator electrodes or any combination of them may, of course, be simply connected in parallel for operation as a high power rectifier. As may be seen, the resulting geometry affords a very rugged mechanical construction and very little of the P–N junction interfaces are exposed, thus reducing humidity and aging effects.

It is to be understood that various equivalent elements or combinations of elements may be substituted for those specifically described in relation to the embodiments of Fig. 1 and Fig. 2. Thus other acceptor activators, such as gallium or aluminum, may be substituted for indium. If a semi-conductor body having P-type conduction characteristics is employed, a donor activator or activators, such as antimony, may be employed in the recesses of the semi-conductor body. The semi-conductor body may itself be made of silicon instead of germanium if desired. The activator members, in each case, are chosen to provide conduction carriers in the surrounding semi-conductor material of an opposite sign to those of the zone associated with the base electrode. While the activator elements do not in themselves exhibit semi-conductor conduction characteristics, being preferably fairly good conductors since they also partially serve as electrodes, reference to their conductivity type is intended to indicate the type of conduction carriers they provide to the semi-conductor.

It is obvious that although our invention has been described in connection with specific embodiments, many modifications may be made without departing from the spirit of the invention. It is to be understood, therefore, that we intend by the appended claims to cover all such modifications as fall within the true spirit and scope of the invention.

What we claim as new and desire to secure by Letters Patent of the United States is:

1. A P–N junction device comprising a semi-conductor body of one conductivity type having a bore therein containing an activator element of the opposite conductivity type fused therein to form a rectifying junction with said semi-conductor body.

2. A P–N junction rectifier comprising a generally cylindrical body of N-type germanium having a relatively deep axial bore therein, a first electrode including antimony in conductive contact with the outer surface of said body, a rod comprising indium within said bore in rectifying contact with said body, and a second electrode having one end embedded in said rod in conductive contact therewith.

3. A P–N junction semi-conductor rectifying device comprising an activator rod for imparting conduction characteristics of one sign to a semi-conductor material, a semi-conductor body having conduction characteristics of the opposite sign surrounding the sides of said rod, said rod being fused to said body to provide a rectifying contact therewith, a first electrode in conductive contact with the outer surface of said body, and a second electrode in conductive contact with said rod.

4. A P–N junction semi-conductor rectifying device comprising a cylindrical activator rod for imparting conduction characteristics of one sign to a semi-conductor material, a co-axial cylindrical semi-conductor body having conduction characteristics of the opposite sign surrounding all but one end of said rod, said rod being fused to said body to provide a rectifying contact therewith, a first electrode in conductive contact with the outer surface of said body, and a second electrode in conductive contact with said rod.

5. A power transistor comprising a semi-conductor body of one conductivity type having a plurality of holes therein, said holes containing an activator element of the opposite conductivity inducing type in rectifying contact with said semi-conductor body.

6. A transistor comprising a semi-conductor body of one conductivity type having a plurality of closely spaced apertures therein, each containing an activator element of the opposite conductivity type fused therein to form separate rectifying junctions with said semi-conductor body.

7. A transistor comprising a semi-conductor body of one conductivity type having at least a pair of holes therein, each of said holes containing a member containing an activator element of the other conductivity inducing type in rectifying contact with said semi-conductor body, a base electrode in conductive contact with the outer surface of said body, an emitter electrode in conductive contact with the activator member in one of said pair of holes, and a collector electrode in conductive control with the activator member in the other of said pair of holes.

8. A transistor comprising a semi-conductor base member of one conductivity type having a pair of closely spaced apertures therein each containing a conductive activator element for providing conduction carriers of the other conductivity type fused therein to form a separate rectifying junction with said semi-conductor body, and emitter and collector electrodes respectively connected to the activator element in each of said pair of apertures.

9. A transistor comprising a semi-conductor body having a plurality of bores therein, said bores being filled with an activator element, means for connecting the activator elements of selected bores to one common terminal, and means for connecting the activator elements of other selected bores adjacent said first selected bores to another common terminal.

10. A transistor comprising a base element comprising a semi-conductor body of one conductivity type having a plurality of apertures therein, and emitter and collector elements comprising bodies of an activator element of the other conductivity type, each filling an aperture in said base element and fused thereto to provide rectifying junctions therewith, means connecting some of said activator members in parallel to form an emitter electrode and means connecting selected other activator members adjacent said some of said members in parallel to form a collector electrode.

11. A transistor comprising a germanium body of one conductivity type having a plurality of closely spaced bores, each extending therein along a major dimension of said body, said bores being filled with an activator element of the opposite conductivity inducing type in rectifying contact with said germanium body, means connecting one set of alternate activator elements in parallel to form an emitter electrode and means connecting the other set of alternate activator elements in parallel to form a collector electrode.

12. A power transistor comprising a semi-conductor body having opposing major surfaces and having a row of apertures along a major dimension thereof and extending therein along another major dimension, said semi-conductor body being of one conductivity type to comprise the base element of the transistor, a base electrode comprising a metallic member in conductive contact with at least one major surface of said body, and a plurality of bodies of an activator element of the opposite conductivity type fused within each of said apertures in rectifying contact with said semi-conductor body, one set of alternate activator bodies being connected in parallel to comprise the emitter electrode and the other set of alternate activator bodies being connected in parallel to form the collector electrode.

13. A power transistor comprising an N-type germanium body having opposing major surfaces and having a row of apertures along a major dimension thereof and extending therein along another major dimension, a base electrode in conductive contact with the major surfaces of said body, and a plurality of bodies of a substantially conductive acceptor activator element fused within each of said apertures in rectifying contact with said germanium body, one set of alternate activator bodies being connected in parallel to comprise the emitter terminal and another set of alternate activator bodies being connected in parallel to comprise the collector terminal.

14. A power transistor comprising an N-type germanium body having opposing major surfaces and having a row of apertures along a major dimension thereof and extending therein along another major dimension, a base electrode comprising a donor activator element in conductive contact with the surfaces of said body, and a plurality of bodies of an indium activator element fused within each of said apertures in rectifying contact with said germanium body, one set of alternate activator bodies being connected in parallel to comprise the emitter terminal and another set of alternate activator bodies being connected in parallel to comprise the collector terminal.

References Cited in the file of this patent

UNITED STATES PATENTS

| | | |
|---|---|---|
| 1,900,018 | Lilienfeld | Mar. 7, 1933 |
| 2,189,617 | Siebert et al. | Feb. 6, 1940 |
| 2,498,666 | Escoffery et al. | Feb. 28, 1950 |
| 2,561,411 | Pfann | July 24, 1951 |
| 2,597,028 | Pfann | May 20, 1952 |
| 2,623,102 | Shockley | Dec. 23, 1952 |
| 2,666,814 | Shockley | Jan. 19, 1954 |

UNITED STATES PATENT OFFICE

Certificate

Patent No. 2,714,183

Patented July 26, 1955

Robert N. Hall and William E. Burch

Application having been made by Robert N. Hall and William E. Burch, the inventors named in the patent above identified, and General Electric Company, a corporation of New York, the assignee, for the issuance of a certificate under the provisions of Title 35, Section 256 of the United States Code, deleting the name of the said Robert N. Hall from the patent as a joint inventor, and a showing and proof of facts satisfying the requirements of the said section having been submitted, it is, this 14th day of June 1960, certified that the name of the said Robert N. Hall is hereby deleted from the said patent as a joint inventor with William E. Burch.

[SEAL]

ARTHUR W. CROCKER,
*First Assistant Commissioner.*

UNITED STATES PATENT OFFICE

CERTIFICATE OF CORRECTION

Patent No. 2,714,183 July 26, 1955

William E. Burch

It is hereby certified that error appears in the printed specification of the above numbered patent requiring correction and that the said Letters Patent should read as corrected below.

Column 1, line 15, for "Our" read -- My --; line 59, after "of" for "our" read -- my --; line 61, after "of", for "our" read -- my --; lines 64 and 67, after "of", for "our", each occurrence, read -- my --; line 70, after "with" for "our" read -- my --; column 4, line 53, after "although", for "our" read -- my --; line 60, after "what", for "we" read -- I --.

Signed and sealed this 26th day of July 1960.

(SEAL)
Attest:

KARL H. AXLINE
Attesting Officer

ROBERT C. WATSON
Commissioner of Patents